(12) United States Patent
Harden

(10) Patent No.: US 10,425,710 B2
(45) Date of Patent: Sep. 24, 2019

(54) SELF-SEALING EXPANDABLE SUBWOOFER

(71) Applicant: BBY SOLUTIONS, INC., Richfield, MN (US)

(72) Inventor: Kenneth Harden, Eden Prairie, MN (US)

(73) Assignee: BBY SOLUTIONS, INC., Richfield, MN (US)

(*) Notice: Subject to any disclaimer, the term of this patent is extended or adjusted under 35 U.S.C. 154(b) by 0 days.

(21) Appl. No.: 16/274,533

(22) Filed: Feb. 13, 2019

(65) Prior Publication Data
US 2019/0268678 A1 Aug. 29, 2019

Related U.S. Application Data

(60) Provisional application No. 62/636,182, filed on Feb. 28, 2018.

(51) Int. Cl.
| | | |
|---|---|---|
| *H04R 1/00* | (2006.01) | |
| *H04R 1/02* | (2006.01) | |
| *H05K 5/06* | (2006.01) | |
| *H05K 5/02* | (2006.01) | |

(52) U.S. Cl.
CPC ............ *H04R 1/02* (2013.01); *H05K 5/0221* (2013.01); *H05K 5/06* (2013.01); *H04R 2201/028* (2013.01); *H04R 2400/11* (2013.01)

(58) Field of Classification Search
CPC . H04R 1/02; H04R 5/02; H04R 1/021; H04R 1/28; H04R 1/2803; H04R 2201/02; H04R 2201/028
See application file for complete search history.

(56) References Cited

U.S. PATENT DOCUMENTS

| | | | | |
|---|---|---|---|---|
| 5,082,084 A | * | 1/1992 | Ye-Ming | H04R 1/021 |
| | | | | 181/153 |
| 5,450,495 A | * | 9/1995 | Goldfarb | H04R 1/02 |
| | | | | 181/196 |
| 5,664,020 A | | 9/1997 | Goldfarb et al. | |
| 5,864,100 A | * | 1/1999 | Newman | H04R 1/02 |
| | | | | 181/153 |
| 7,116,795 B2 | | 10/2006 | Tuason et al. | |
| 9,014,408 B2 | | 4/2015 | Thome et al. | |
| 9,102,283 B2 | | 8/2015 | O'neal | |
| 2005/0031148 A1 | * | 2/2005 | McNary | H04R 1/2811 |
| | | | | 381/334 |

(Continued)

*Primary Examiner* — Matthew A Eason
(74) *Attorney, Agent, or Firm* — Tysver Beck Evans

(57) ABSTRACT

The present disclosure is directed to a subwoofer speaker assembly that has a housing which is convertible between a compact volume mode and an expanded volume mode. The speaker assembly includes at least one driver contained within the housing. The housing itself comprises an internal frame and an external shell, moveable relative to the internal frame. The internal frame and the external shell defining an interior volume of the housing, in the compact mode the internal volume is a first volume, in the expanded mode the internal volume is a second volume, wherein the second volume is greater than the first volume. Positioned between the overlapping and parallel walls of the internal frame and the external shell is at least one sealing member which provides an airtight seal between the internal frame and the external shell.

1 Claim, 3 Drawing Sheets

(56) References Cited

U.S. PATENT DOCUMENTS

| | | | |
|---|---|---|---|
| 2005/0207603 A1* | 9/2005 | Tse | H04R 5/02 381/351 |
| 2006/0272885 A1* | 12/2006 | Lee | H04R 1/2803 181/199 |
| 2007/0017834 A1* | 1/2007 | Chang | H04R 5/02 206/312 |
| 2007/0029131 A1 | 2/2007 | Pan et al. | |
| 2007/0064970 A1* | 3/2007 | Yang | H04R 1/2803 381/388 |
| 2011/0235847 A1* | 9/2011 | Bhutani | H04R 5/02 381/395 |
| 2012/0189150 A1 | 7/2012 | Thome et al. | |

* cited by examiner

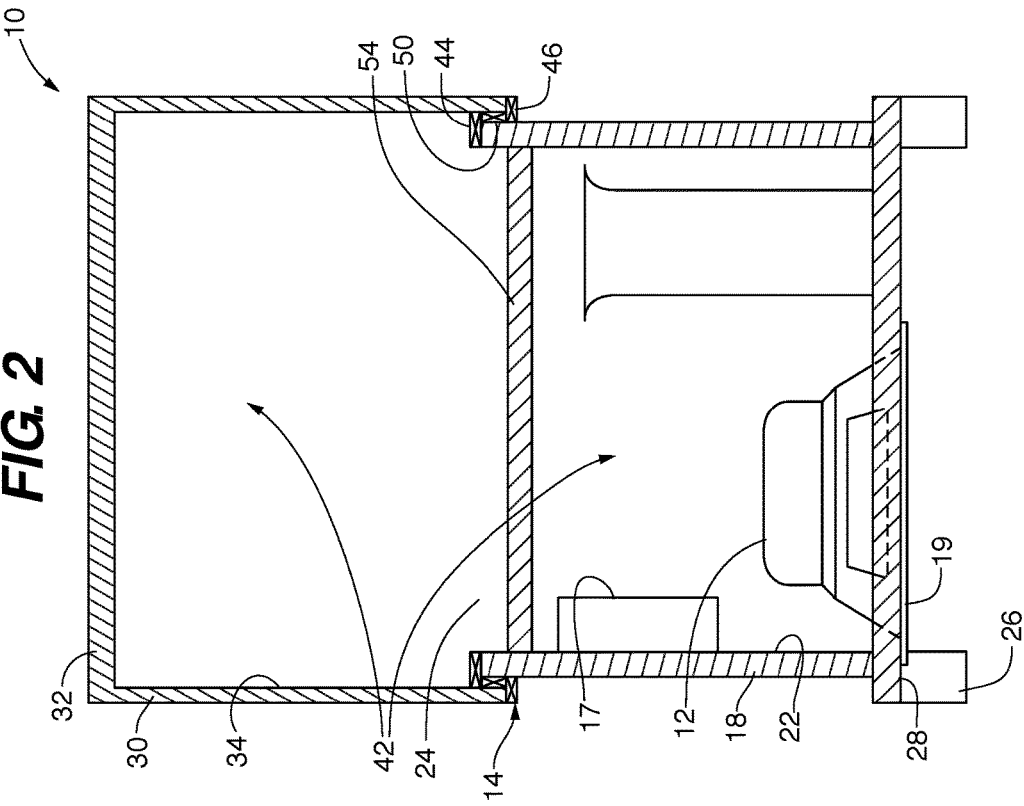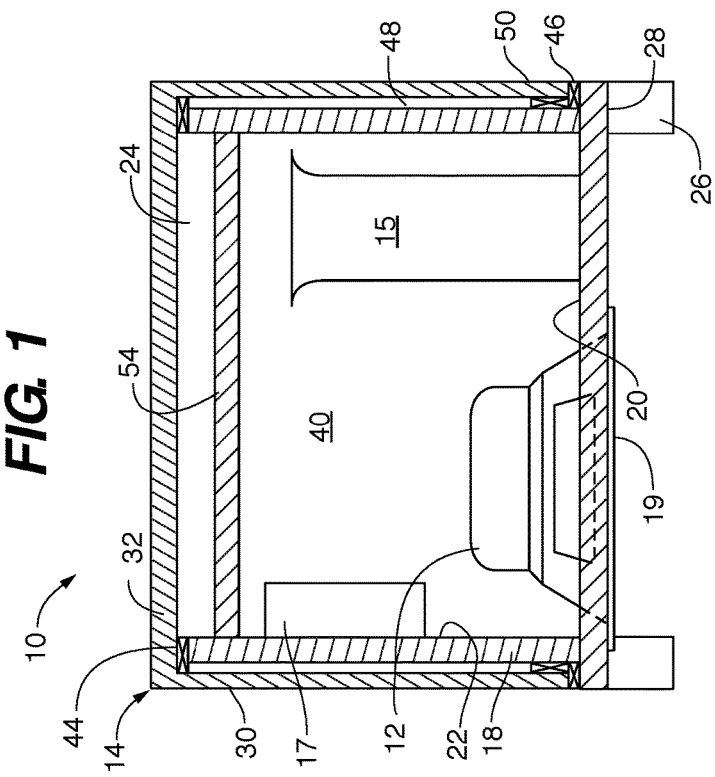

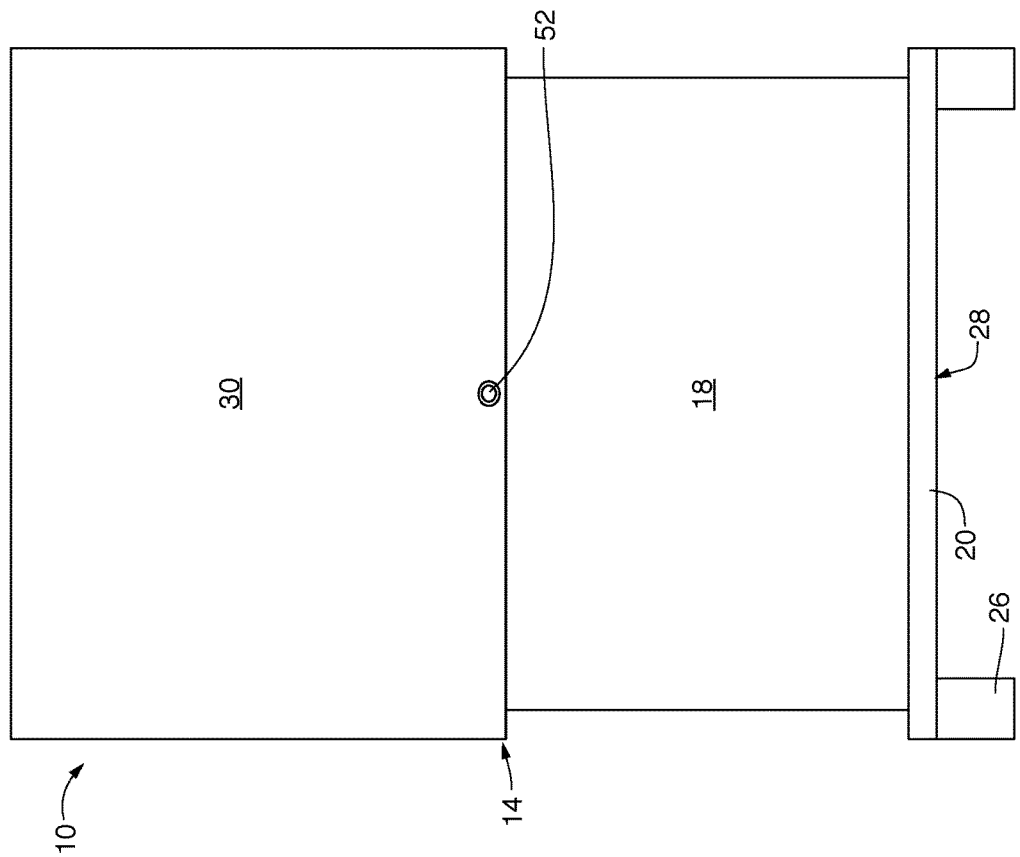
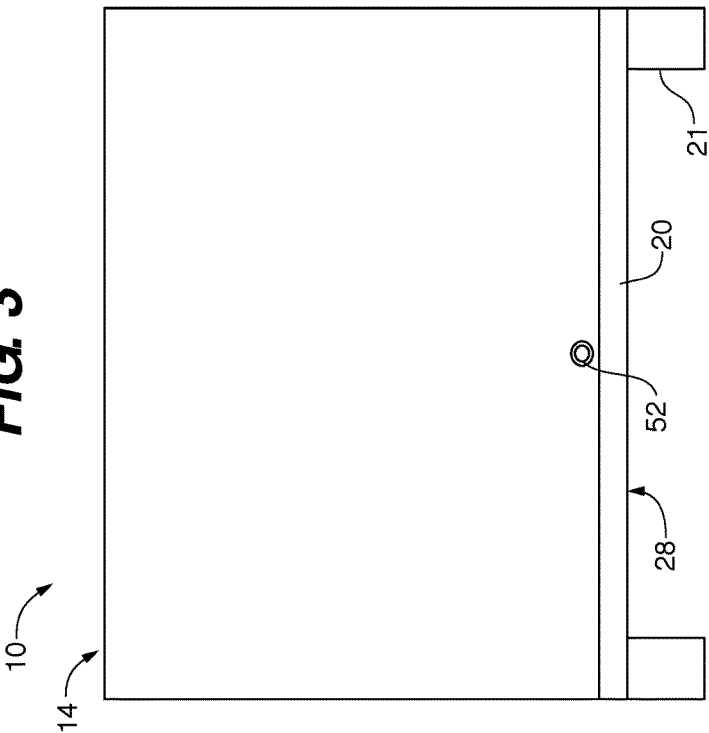

SELF-SEALING EXPANDABLE SUBWOOFER

FIELD OF THE INVENTION

The present disclosure is directed to the field of speakers and more specifically subwoofer type speakers. Such speakers as described herein however, may include traditional full-range speaker, such as a bookshelf speaker, center channel speaker, tower speaker, in-wall or in-ceiling speaker. Such speakers may be present in a variety of environments such as in automobiles, homes, and commercial settings; and may include professional audio components, computer speakers, sound-bars, headphones, or any other audio product which reproduces low-frequency bass from an enclosure.

A "subwoofer" as used herein describes an assembly of one or more speaker drivers (woofers) contained within a cabinet or housing. Subwoofers are typically employed in stereo, home theater, or other entertainment systems to add or enhance bass response. Subwoofers have a variety of configurations and styles including "active" subwoofers, which include a built-in amplifier; bass reflex, which includes a port or vent in the subwoofer housing, acoustic suspension, wherein the cabinet of the subwoofer is sealed; and many other designs and configurations.

SUMMARY

Embodiments of the disclosure are directed to subwoofers having a convertible housing or cabinet that is expandable between a compact state and an expanded state. In the compact state the subwoofer housing defines a first internal volume. As the housing is expanded to the expanded state, the internal volume increases, such that in the expanded state the internal volume is greater than when in the compact state. Generally, the bigger the enclosure, the better the capacity to increase overall bass output and/or lower frequency response; thus, by providing the housing with an increased enclosure volume in the expanded state the subwoofer is able to provide better bass performance.

To provide for this expandability the housing is comprised of an internal frame about which an external shell is disposed. The external shell is moveable vertically, or in any other direction desired, relative to the internal frame in the manner of two interlocking cups. At the top edge or rim of the internal frame and the bottom edge or rim of the external shell are overlapping lips which prevent the frame and shell from being unintentionally separated, and which also form a space between the shell and frame to allow the shell and frame to slide vertically relative to one another. In some embodiments, a sealing strip or strips may be interposed between the lips of the shell and frame to ensure an air-tight seal between the fame and shell is maintained when in the compact state, the expanded state or transitioning therebetween.

In at least one embodiment the shell and frame include a locking mechanism that would "click" the shell in place relative to the frame in either mode so as to provide user feedback to indicate that the housing is mechanically secure in the desired mode. In some embodiments, a sensor communicates with amplifier or driver to tell it what position/mode the cabinet is in and adjust the bass output accordingly.

BRIEF DESCRIPTION OF THE DRAWINGS

FIG. 1 is a sectional view of an embodiment of the subwoofer in the compact mode.

FIG. 2 is a sectional view of the subwoofer shown in FIG. 1 in the expanded mode.

FIG. 3 is a front exterior view of the subwoofer shown in FIG. 1.

FIG. 4 is a front exterior view of the subwoofer shown in FIG. 2.

DETAILED DESCRIPTION

Figure 5:
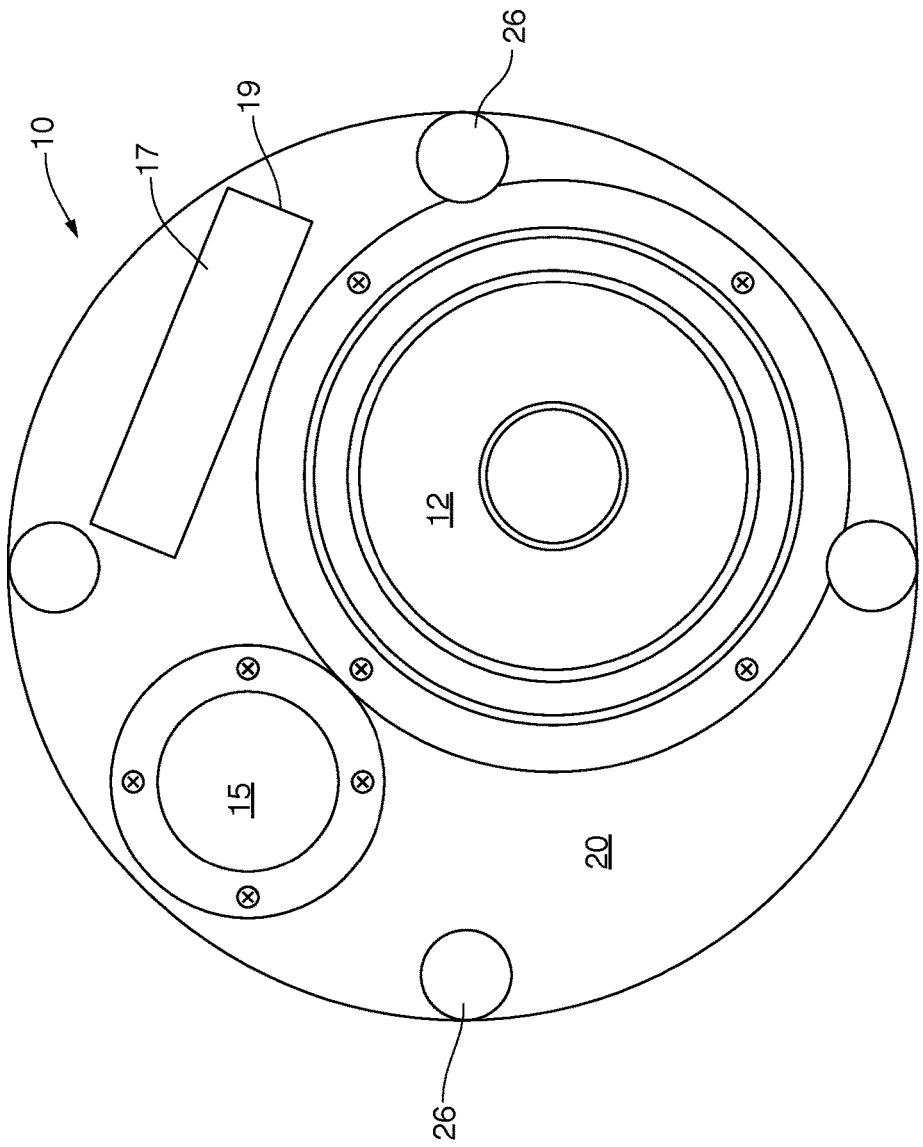
FIG. 5 is an internal top down view of the interior components of an embodiment of the subwoofer.

As described above, a subwoofer 10, such as is shown in FIG. 1, is comprised of at least one speaker driver or woofer 12 contained within a cabinet or housing 14. Though the subwoofer speaker 10 may be configured in a wide variety of configurations, including as a passive subwoofer with electronics such as an amplifier and/or other components absent or external to the housing 14; in the embodiment shown herein, the subwoofer includes internal components such as a port 15, an amplifier 17, and control interface 19 contained within the housing 14.

The subwoofer 10 of the present disclosure has a unique two-part housing 14 which provides the subwoofer 10 with the ability to transition between a low volume compact mode, illustrated in FIGS. 1 and 3; and a larger volume expanded mode, illustrated in FIGS. 2 and 4.

The housing 14 is comprised of a container-like internal frame 18 that encloses the woofer 12 and other components of the subwoofer speaker. This internal frame 18 is comprised of a base member 20 and a side wall or walls 22 which extend (vertically) from the base member 20 to define a top opening 24. The base member 20 may have one or more feet 26 which extend downward from the exterior surface 28 of the base member 20. In some embodiments the feet 26 may include wheels, castors or other mechanisms to provide the subwoofer 10 with mobility or ease of movement.

Slidably engaged to the side wall 22 of the internal frame 18 is an outer or external shell 30. As is illustrated in FIGS. 1 and 2, the shell 30 is comprised of a top member 32 and an extension wall or walls 34 what extends vertically away from the top member 32 and extend along at least part of the length of the side wall(s) 22 of the internal frame 18. The side wall(s) 22 and the extension wall(s) 34 are parallel to each other.

The internal frame 18 and/or external shell 30 may be constructed from any material suitable for supporting the weight of the speaker and its components and providing desirable acoustic performance. Such materials include but are not limited to wood, plastics, metal, glass, and any combinations thereof.

In the compact mode shown in FIG. 1, the top member 32 of the external shell 30 covers the top opening 24 of the internal frame 18 to define a first internal volume 40 of the housing. From the compact mode shown in FIGS. 1 and 3, the housing 14 may be transitioned to a high performance or expanded mode shown in FIGS. 2 and 4, wherein the housing defines a second internal volume 42 that is greater than the first internal volume 40. To make this transition from compact mode to expanded mode, the external shell 30 may be slid upward such that the distance of the top member 32 from the base member 20 is increased, with the extent of the distance being limited by the need to ensure at least some overlap of the side wall 22 and extension wall 34 in order to maintain the structure of the housing 14.

In at least one embodiment, when the housing 14 is in the expanded mode shown in FIGS. 2 and 4, the interior volume defined by the internal frame 18 and the external shell 30 is at least double the volume of the housing interior when in the compact mode shown in FIGS. 1 and 3.

In some embodiments, to ensure that the external shell 30 is not inadvertently removed entirely from the internal frame 18, the internal frame employs an outwardly extending perimeter seal member 44 about the side wall(s) 22 where the top opening 24 is defined; likewise, the extension wall(s) 34 of the external shell include inwardly extending perimeter seal member 46. The interface of the members 44 and 46, such as is depicted in FIG. 4 prevents the external shell 30 from being inadvertently removed from about the internal frame 18.

In at least some embodiments, an example of which is shown in FIG. 1, the side wall(s) 22 and extension wall(s) 34 define a slide gap or space 48 therebetween which allows the walls to slide relative to one another with minimal interference or contact when transitioning between the compact mode and the expanded mode.

In some embodiments, a gap sealing member or members 50 is positioned within the space 48. This gap sealing member 50 will aid in forming an air-tight seal between the side wall(s) 22 and extension wall(s) 34 when the housing is in either the compact mode shown in FIG. 3 or the expanded mode shown in FIG. 4, while still allowing the external shell 30 the ability to move freely relative to the internal frame 18. In some embodiments the at least one embodiment gap sealing member 50 is any soft, pliable material such as foam, rubber plastic, fabric, or other material or combination of materials that will create an air-tight or near air-tight seal when pressed against the rigid material of the cabinet housing 14 or held against similar materials by application of force. In at least one embodiment gap sealing member 50 is a foam block material of open or closed cell construction. In at least one embodiment the gap sealing member is comprised of polyvinylchloride (PVC) adhesively secured to one or the other of the side wall(s) 22 and extension wall(s) 34.

Depending on the size and shape of the housing 14, the external shell 30 will include a locking pin, tab, or other type of engagement mechanism 52 for securing the external shell 30 to the internal frame 18, in at least the fully expanded position shown in FIG. 2. In some embodiments mechanism 52 may comprise a pin that extends through the external shell 30 to engage an opening in the internal frame 18. In at least one embodiment the mechanism 52 is comprised of a magnetic area of a first polarity on a region of the external shell 30 and a region of opposing magnetic polarity on an adjacent region of the internal frame 18, such that the regions magnetically attract one another and "lock" the external shell 30 to the internal frame 18 when in the expanded mode shown in FIGS. 2 and 4. In such an embodiment a small application of force is sufficient to break the connection and allow the housing to transition back to the compact mode when desired.

Again, depending on the size and shape of the housing 14, in some embodiments, examples of which are shown in FIGS. 1 and 2, the internal frame 18 may include one or more cross-braces 54 to reinforce and/or maintain the structural integrity of the side wall(s) 22. The cross-brace(s) 54 do not interfere with air-flow within the interior of the housing 14. The cross-brace(s) 54 may be removable from the interior of the frame 18 if desired.

In the embodiment shown in FIGS. 3-5 it is shown that the subwoofer speaker 10 includes a driver 12 within the confines of the internal frame 18. Other components that may also be present therein include an amplifier 17, an air-flow (reflex) port 15, and an interface area 19 where manual controls, inputs and outputs and other interfaces are provided. In at least one embodiment, such as is shown in FIG. 5, all of these elements are affixed or incorporated into the base member 20. Such an assemblage allows the side wall(s) 22 and the extension wall(s) 34 to be oriented internally or externally to one another as desired. In embodiments, where speaker components are incorporated into the side wall(s) 22 this arrangement will necessitate that the extension wall(s) 34 must be external to the side wall(s) 22 such as in the manner illustrated in FIGS. 1-4.

When the volume of the housing 14 is changed by transitioning to and from the compact mode and the expanded mode the speaker 10 may include additional elements to 'tune' the port 15. In some embodiments, such tuning is done manually or automatically via electronic equalization, by mechanically adjusting the length of the port 15, providing an adjustable port cover to partially or fully block the port's opening as desired, providing a second port which is blocked or unblocked depending on the volume of the housing 14, etc.

In some embodiments the housing 14 of speaker 10 is configured as a passive radiator, a bandpass, horn-loaded, or other cabinet style.

The many features and advantages of the invention are apparent from the above description. Such features and advantages include a subwoofer that is more easily transported when in the compact mode and one that provides adjustable acoustic performance by changing the housing from the compact mode to the expanded mode. Numerous modifications and variations will readily occur to those skilled in the art. Since such modifications are possible, the invention is not to be limited to the exact construction and operation illustrated and described. Rather, the present invention should be limited only by the following claims.

What is claimed is:

1. A subwoofer speaker assembly comprising:
   at least one driver;
   a housing, the housing comprising an internal frame and an external shell, wherein the external shell is moveable relative to the internal frame between a compact mode and an expanded mode;
      the internal frame having a base member and a side wall extending away from the base member, the side wall defining an opening, an amplifier being mounted to a portion of the side wall, the base member defining a driver opening and a port opening, the at least one driver is positioned over the driver opening, the port opening having an adjustable port cover configured to partially or fully block the port opening;
      the external shell having a top member and an extension wall extending from the top member, the top member being positioned over the opening, the side wall and the extension wall being parallel to one another and defining a gap therebetween; and
   at least one sealing member positioned within the gap and providing an airtight seal between the internal frame and the external shell, the internal frame and the external shell defining an interior volume of the housing, in the compact mode the internal volume is a first volume, in the expanded mode the internal volume is a second volume, wherein the second volume is greater than the first volume.

* * * * *